US009691314B2

(12) United States Patent
Kim et al.

(10) Patent No.: US 9,691,314 B2
(45) Date of Patent: Jun. 27, 2017

(54) DISPLAY PANEL AND DISPLAY DEVICE INCLUDING THE SAME

(71) Applicant: SAMSUNG DISPLAY CO., LTD., Yongin, Gyeonggi-Do (KR)

(72) Inventors: Seul-Ki Kim, Anyang-si (KR); Seung-Jin Kim, Asan-si (KR); Jeong-Hyun Lee, Asan-si (KR); Dong Hun Lee, Goyang-si (KR); Yun Seok Han, Daegu (KR)

(73) Assignee: SAMSUNG DISPLAY CO., LTD, Yongin, Gyeonggi-Do (KR)

( * ) Notice: Subject to any disclaimer, the term of this patent is extended or adjusted under 35 U.S.C. 154(b) by 212 days.

(21) Appl. No.: 14/293,905

(22) Filed: Jun. 2, 2014

(65) Prior Publication Data

US 2015/0199929 A1 Jul. 16, 2015

(30) Foreign Application Priority Data

Jan. 15, 2014 (KR) ........................ 10-2014-0005311

(51) Int. Cl.
*G01R 31/30* (2006.01)
*G09G 3/00* (2006.01)

(52) U.S. Cl.
CPC .................................... *G09G 3/006* (2013.01)

(58) Field of Classification Search
CPC ........... G09G 3/00; G09G 3/006; G01R 31/00
See application file for complete search history.

(56) References Cited

U.S. PATENT DOCUMENTS 5,828,428 A * 10/1998 Kim .................. G02F 1/136204 349/139
6,005,647 A 12/1999 Lim
6,025,891 A * 2/2000 Kim .................. G02F 1/136204 349/40
7,129,520 B2 * 10/2006 Kim ...................... G02F 1/1309 257/48
7,956,945 B2 6/2011 Kim
8,207,930 B2 * 6/2012 Na ...................... G02F 1/13458 324/760.01
2003/0193623 A1 * 10/2003 Lim .................... G02F 1/13458 349/40

(Continued)

FOREIGN PATENT DOCUMENTS

KR 10-2004-0060044 7/2004
KR 10-0477127 3/2005

(Continued)

*Primary Examiner* — Jermele M Hollington
*Assistant Examiner* — Alvaro Fortich
(74) *Attorney, Agent, or Firm* — F. Chau & Associates, LLC

(57) ABSTRACT

A display panel includes a plurality of display signal lines positioned in a display area. A plurality of test pads are positioned in a peripheral area around the display area and are respectively connected to the plurality of display signal lines. The plurality of test pads include a first test pad positioned at an edge of the peripheral area and a second test pad positioned at the middle of the peripheral area. A shorting bar is connected to the plurality of test pads through a contact assistant. The first test pad is connected to the second test pad through a connection line.

10 Claims, 15 Drawing Sheets

(56) References Cited

U.S. PATENT DOCUMENTS

| | | | | |
|---|---|---|---|---|
| 2004/0119925 | A1* | 6/2004 | Moon | G02F 1/1345 349/139 |
| 2007/0002204 | A1* | 1/2007 | Kim | G02F 1/1345 349/54 |
| 2007/0046320 | A1* | 3/2007 | Kang | G09G 3/3666 324/754.03 |
| 2008/0074137 | A1* | 3/2008 | Kim | G02F 1/13458 324/750.3 |
| 2008/0204618 | A1* | 8/2008 | Jung | G02F 1/13452 349/40 |
| 2009/0243972 | A1* | 10/2009 | Her | G09G 3/20 345/55 |
| 2011/0279746 | A1* | 11/2011 | Kim | G02F 1/136259 349/54 |
| 2012/0228620 | A1* | 9/2012 | Chang | G02F 1/1345 257/59 |
| 2013/0057799 | A1 | 3/2013 | Zhuang | |
| 2013/0265072 | A1* | 10/2013 | Kim | G09G 3/006 324/754.01 |
| 2013/0321251 | A1* | 12/2013 | Kang | G09G 3/36 345/87 |
| 2014/0375344 | A1* | 12/2014 | Wang | G09G 3/006 324/750.3 |

FOREIGN PATENT DOCUMENTS

| | | |
|---|---|---|
| KR | 10-0502100 | 7/2005 |
| KR | 10-0521259 | 10/2005 |
| KR | 10-2006-0005550 | 1/2006 |
| KR | 10-0749470 | 8/2007 |
| KR | 10-2008-0044986 | 5/2008 |
| KR | 10-2013-0077189 | 7/2013 |

* cited by examiner

DISPLAY PANEL AND DISPLAY DEVICE INCLUDING THE SAME

CROSS-REFERENCE TO RELATED APPLICATION

This application claims priority to Korean Patent Application No. 10-2014-0005311 filed in the Korean Intellectual Property Office on Jan. 15, 2014, the disclosure of which is incorporated by reference herein in its entirety.

TECHNICAL FIELD

The present invention relates to a display panel and a display device including the same, and in detail, relates to a display panel including a test pad to test the display panel and a display device including the same.

DISCUSSION OF THE RELATED ART

Upon manufacture, display devices, such as liquid crystal displays (LCDs) and organic light emitting displays (OLEDs), may undergo a process of determining whether the display panel has defects. Such process is performed by applying a test signal to the display panel via test pads connected to signal lines. During the testing process, static electricity may easily flow to the test pads, damaging the pads.

SUMMARY

According to an exemplary embodiment of the present invention, a display panel includes a plurality of display signal lines positioned in a display area. A plurality of test pads are positioned in a peripheral area around the display area and are respectively connected to the plurality of display signal lines. A shorting bar is connected to the plurality of test pads through a contact assistant. The plurality of test pads include a first test pad positioned at an edge of the peripheral area and a second test pad positioned at the middle of the peripheral area. The first test pad is connected to the second test pad through a connection line.

According to an exemplary embodiment of the present invention, a display device includes a plurality of display signal lines positioned in a display area. A plurality of test pads are positioned in a peripheral area around the display area and respectively correspond to end portions of a plurality of display signal lines. A shorting bar is connected to a plurality of test pads through a contact assistant. The plurality of test pads include a first test pad positioned at an edge of the peripheral area and a second test pad positioned at the middle of the peripheral area. The first test pad is connected to the second test pad through a connection line.

The first test pad may be larger than the second test pad.

A passivation layer may be positioned between the plurality of test pads and the shorting bar and the contact assistant. The passivation layer may include a plurality of first contact holes exposing the first test pad and one or more second contact hole exposing the second test pad. The number of the first contact holes may be larger than the number of the second contact holes.

The connection line may include a first portion extending substantially parallel to the shorting bar and a second portion crossing the shorting bar.

A width of the second portion may be larger than a width of the first portion.

The first and second test pads may be disposed in the same column sequentially from the first test pad.

The plurality of test pads may be alternately arranged in a plurality of rows or columns. The first test pad and the second test pad may be disposed in at least one row or column.

A second shorting bar may be provided. The shorting bar and the second shorting bar may respectively correspond to the plurality of rows or columns.

The plurality of test pads and the connection line may be positioned at the same layer. The shorting bar may be positioned at a different layer from the test pad.

The plurality of display signal lines may form a fan-out region in the peripheral area.

The display device may further include a driver connected to the end portions of the plurality of display signal lines. The driver may apply a signal to the plurality of display signal lines.

According to an exemplary embodiment of the present invention, a display panel comprises a first test pad, a second test pad, a shorting bar, and a connection line. The first test pad is positioned at a first location of a peripheral area of the display panel. The first test pad is connected to a first signal line. The second test pad is positioned at a second location of the peripheral area. The second test pad is connected to a second signal line. A shorting bar is connected to the first test pad and the second test pad a contact assistant. A connection line connects the first test pad to the second test pad. The first test pad has a larger area than the second test pad.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
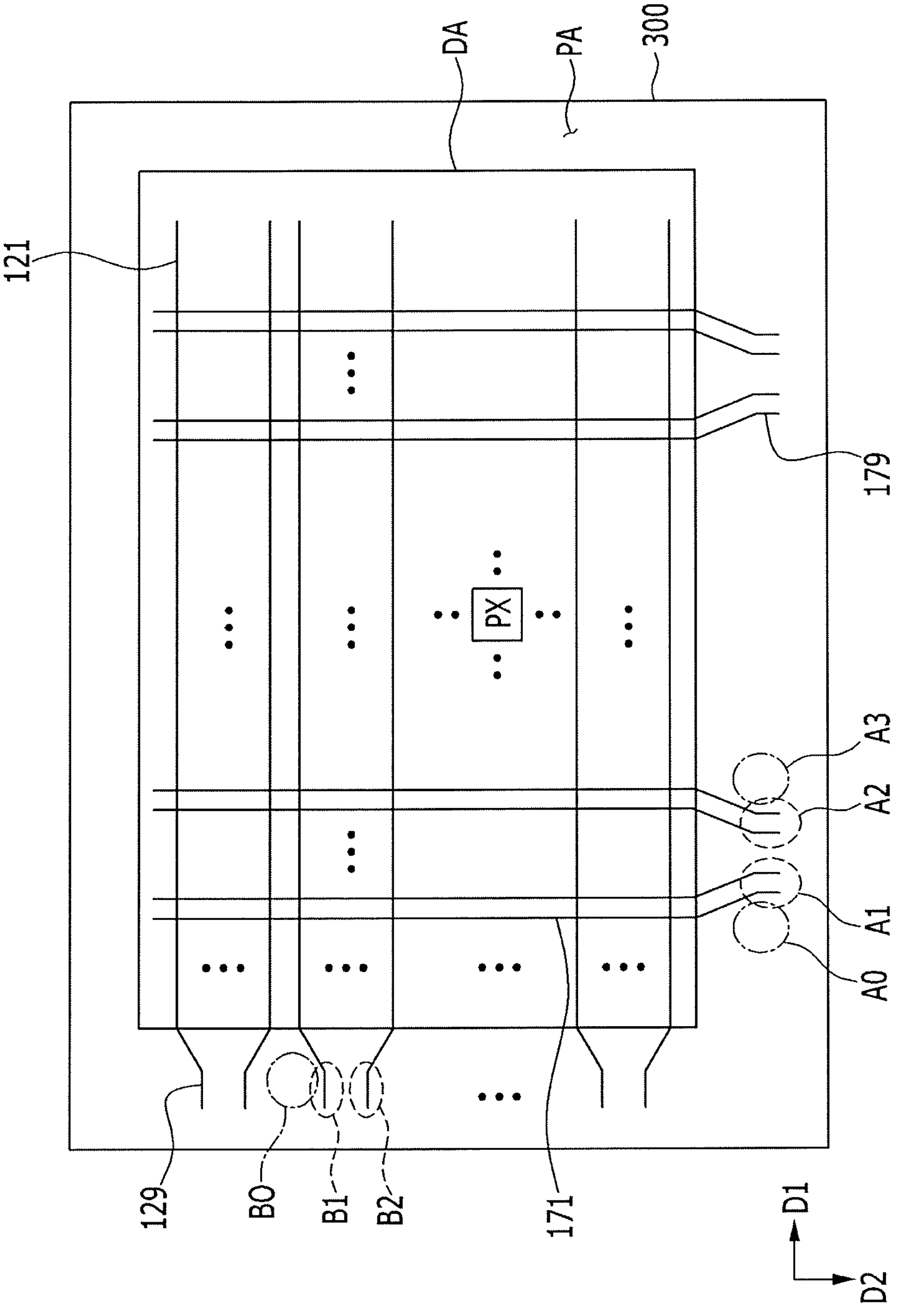
FIG. 1 is a layout view of a display panel according to an exemplary embodiment of the present invention.

Exemplary embodiments of the present invention will be described in detail hereinafter with reference to the accompanying drawings. Like reference numerals may designate like or similar elements throughout the specification and the drawings. It will be understood that when an element such as a layer, film, region, or substrate is referred to as being "on," "connected to," or "adjacent to" another element, it can be directly on, connected or adjacent to the other element or intervening elements may also be present. As used herein, the singular forms "a," "an," and "the" are intended to include the plural forms as well, unless the context clearly indicates otherwise.

FIG. 1 is a layout view of a display panel according to an exemplary embodiment of the present invention.

Referring to FIG. 1, a display panel 300 according to an exemplary embodiment of the present invention includes a display area DA displaying an image and a peripheral area PA positioned around the display area DA.

The display area DA includes a plurality of display signal lines and a plurality of pixels connected to the display signal lines.

The display signal lines include a plurality of gate lines 121 transmitting gate signals and a plurality of data lines 171 transmitting data voltages. The plurality of gate lines 121 extend substantially in a first direction D1, for example, a row direction, and the gate lines 121 may be parallel to each other. The plurality of data lines 171 may be parallel to each other and intersect the gate lines 121. The plurality of data lines 171 extend substantially in a second direction D2 crossing the first direction D1, for example, in a column direction.

A plurality of pixels PX may display primary colors. For example, the pixel PX may display their respective unique primary colors, which is called spatial division, or each of the pixels PX may alternately display primary colors over time, which is called temporal division. A desired color can be recognized by a spatial or temporal sum of the primary colors. Examples of the primary colors include red, green, blue. Each pixel PX includes a color filter for displaying primary colors or the pixel PX may be supplied with light of a primary color.

Each pixel PX may include a switching element such as a thin film transistor connected to a display signal line, a pixel electrode (not shown) connected to the switching element, and an opposed electrode (not shown) facing the pixel electrode. A plurality of pixels PX may be arranged substantially in a matrix shape.

According to an exemplary embodiment of the present invention, when the display panel 300 is included in an organic light emitting device, an organic emission layer is positioned between the pixel electrode and the opposed electrode, forming a light emitting diode (LED).

According to an exemplary embodiment of the present invention, when the display panel 300 is included in a liquid crystal display, the display panel 300 includes a lower panel and an upper panel including a plurality of thin film transistors, and a liquid crystal layer (not shown) positioned between the lower and upper panels. The pixel electrode and the opposed electrode generate an electric field to the liquid crystal layer, determining an alignment direction of liquid crystal molecules. Accordingly, the luminance of light passing through the liquid crystal layer may be controlled.

In the display area DA, an organic layer including an organic insulating material may be further positioned between the thin film transistor and the pixel electrode.

The plurality of gate lines 121 are formed substantially parallel to each other in the display area DA. The gate lines 121 are gathered in groups, each group forming a fan shape in the peripheral area PA. Accordingly, in the peripheral area PA, the spacing between the gate lines 121 decreases. End portions of the gate lines 121 in the peripheral area PA extend parallel to each other. Such fan-shaped group in the peripheral area PA is referred to as a fan-out region. Each gate line 121 includes an end portion 129 for connection with an external device, e.g., a gate driver (not shown). A contact assistant (not shown) is positioned on the end portion 129 and is electrically connected to the end portion 129 of the gate line 121. Although not shown in FIG. 1, the end portion 129 of the gate line 121 may also be connected to a gate test pad (not shown).

The plurality of data lines 171 are formed substantially parallel to each other in the display area DA. The data lines 171 are gathered in groups, each group forming a fan shape in the peripheral area PA. Accordingly, in the peripheral area PA, the spacing between the data lines 171 decreases. End portions of the data lines 171 extend parallel to each other. Such fan-shaped group in the peripheral area PA forms a fan-out region. Each data line 171 includes an end portion 179 for connection with an external device, e.g., a data driver (not shown). A contact assistant (not shown) is positioned on the end portion 179 and is electrically connected to the end portion 179 of the data line 171. Although not shown in FIG. 1, the end portion 179 of the data line 171 may also be connected to a data test pad (not shown).

An IC chip or a film-type gate driver and a data driver having an IC chip may be mounted on the end portion 129 of the gate line 121 or the end portion 179 of the data line 171. The organic layer may be removed from the end portion 129 of the gate line 121 and the end portion 179 of the data line 171 positioned in the peripheral area PA.

In an exemplary embodiment of the present invention, the gate lines 121 extend in a row direction, and the data lines 171 extend in a column direction. However, exemplary embodiments of the present invention are not limited thereto. Alternatively, the gate lines 121 may extend in the column direction, and the data lines 171 may extend in the row direction.

Figure 2:
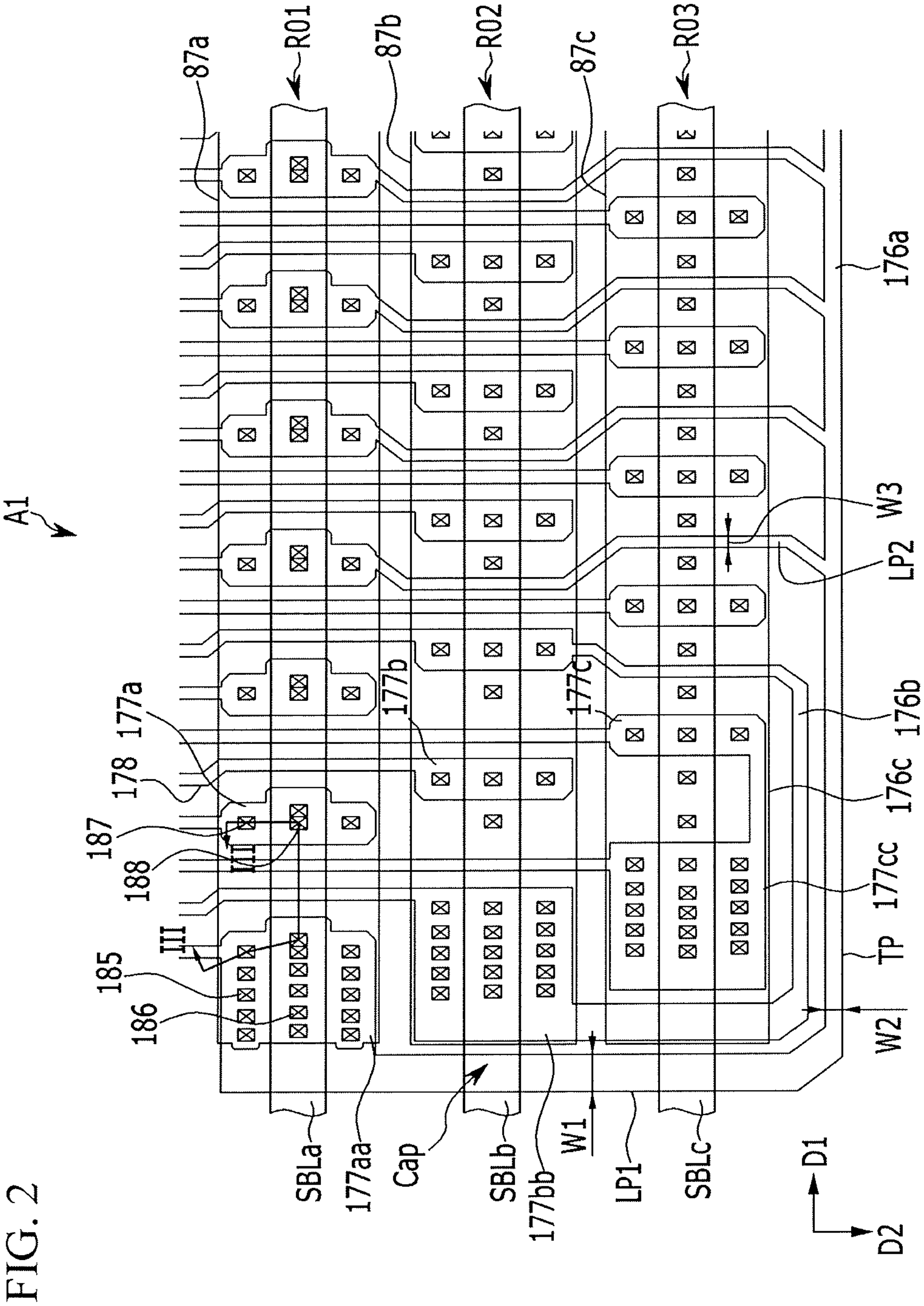
FIG. 2 is an enlarged layout view of a portion 'A1' of a display panel shown in FIG. 1, according to an exemplary embodiment of the present invention.
Figure 3:
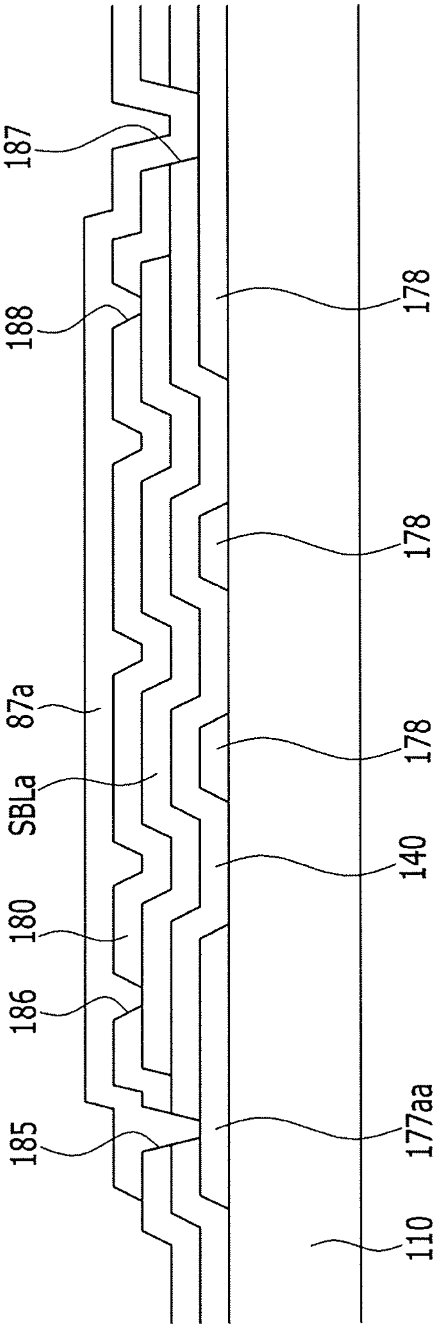
FIG. 3 is a cross-sectional view taken along a line of FIG. 2, according to an exemplary embodiment of the present invention.

FIG. 2 is an enlarged layout view of a portion 'A1' of a display panel shown in FIG. 1, according to an exemplary embodiment of the present invention. FIG. 3 is a cross-sectional view taken along a line of FIG. 2, according to an exemplary embodiment of the present invention. FIG. 2 shows edge portions of a plurality of data test pads positioned in a fan-out region.

Referring to FIG. 2 and FIG. 3, a plurality of gate conductors including a plurality of data leads 178, a plurality of data test pads 177*a*, 177*b*, 177*c*, 177*aa*, 177*bb*, and 177*cc*, and a plurality of connection lines 176*a*, 176*b*, and 176*c* are formed on an insulation substrate 110 made of glass or plastic.

The data lead 178 physically or electrically connects the end portion 179 of the data line 171 in the fan-out region with the data test pads 177*a*, 177*b*, 177*c*, 177*aa*, 177*bb*, and 177*cc*. The data lead 178 may substantially extend in the second direction D2 (e.g., the column direction).

The plurality of data test pads 177*a*, 177*b*, 177*c*, 177*aa*, 177*bb*, and 177*cc* may be arranged in at least one row. FIG. 2 shows an example of a plurality of data test pads 177*a*, 177*b*, 177*c*, 177*aa*, 177*bb*, and 177*cc* that are alternately arranged in three rows RO1, RO2, and RO3. For example, the data test pads 177*a*, 177*b*, 177*c*, 177*aa*, 177*bb*, and 177*cc* positioned in (3N−2)-th (N is a natural number of 1 or more) columns starting from a side edge of a fan-out region may be positioned in a first row RO1, the data test pads 177*a*, 177*b*, 177*c*, 177*aa*, 177*bb*, and 177*cc* positioned in (3N−1)-th columns starting from the side edge may be sequentially positioned in a second row RO2, and the data test pads 177*a*, 177*b*, 177*c*, 177*aa*, 177*bb*, and 177*cc* positioned in (3N)-th columns starting from the side edge may be sequentially positioned in a third row RO3. However, the number of the rows RO1, RO2, and RO3 is not limited thereto.

According to an exemplary embodiment of the present invention, among a plurality of data test pads 177*a*, 177*b*, 177*c*, 177*aa*, 177*bb*, and 177*cc* positioned in a fan-out region, at least one of the data test pads 177*aa*, 177*bb*, and 177*cc* positioned at an edge of the fan-out region is extended and has a larger area than the data test pads 177*a*, 177*b*, and 177*c* that are positioned at the middle of the fan-out region. The test pad 177*aa*, 177*bb*, or 177*cc* may be extended by about 1.5 times to about 5 times the area of the data test pad 177*a*, 177*b*, or 177*c*, but is not limited thereto.

According to an exemplary embodiment of the present invention, at least one of the data test pads 177*aa*, 177*bb*, and 177*cc* positioned at the edge of the fan-out region may be connected to the data test pads 177*a*, 177*b*, and 177*c* positioned at the middle of the fan-out region through the connection lines 176*a*, 176*b*, and 176*c*.

As shown in FIG. 2, the data test pad 177*aa* positioned at the edge of the fan-out region is connected to at least one data test pad 177*a* positioned at the middle of the fan-out region through the connection line 176*a*, the data test pad 177*bb* positioned at the edge of the fan-out region is connected to at least one data test pad 177*b* positioned at the middle of the fan-out region through the connection line 176*b*, and the data test pad 177*cc* positioned at the edge of the fan-out region is connected to at least one data test pad 177*c* positioned at the middle of the fan-out region through the connection line 176*c*. The data test pads 177*a*, 177*b*, and 177*c* connected to the data test pads 177*aa*, 177*bb*, and 177*cc* positioned at the edge of the fan-out region may be sequentially positioned from a right or left edge of one fan-out region.

For example, among the data test pads 177*aa*, 177*bb*, and 177*cc* positioned at the edge of the fan-out region, the outermost data test pad 177*aa* may be connected to a plurality of data test pads 177*a* positioned at the middle of the fan-out region. A predetermined number (e.g., five or seven, but not limited thereto) of data test pads 177*a* may be connected to the data test pad 177*aa* from the right or left edge of a fan-out region.

When other signal lines, other pads, or patterns are spaced apart from the connection lines 176*a*, 176*b*, and 176*c* in such an extent that static electricity is less likely to flow to the connection lines 176*a*, 176*b*, and 176*c*, for example, when a gap between the connection lines 176*a*, 176*b*, and 176*c* and the other signal lines, the other pads, or the patterns disposed under the connection lines 176*a*, 176*b*, and 176*c* is large enough to prevent static electricity flowing to the connection lines 176*a*, 176*b*, and 176*c*, the outermost data test pad 177*aa* in the fan-out region may be connected to the data test pad 177*a* positioned substantially at a middle of a fan-out region through the connection line 176*a* or may be connected to all of the data test pads 177*a* positioned at the middle of the fan-out region.

The data test pad 177*bb* may be connected to an adjacent data test pad 177*b* positioned at the middle of the fan-out region through the connection line 176*b*, and the data test pad 177*cc* may be connected to an adjacent data test pad 177*c* through the connection line 176*c*.

The connection lines 176*a*, 176*b*, and 176*c* each include a first portion TP extending in the first direction D1 (e.g., the row direction) and a second portion LP1 and a third portion LP2 extending in the second direction D2 (e.g., the column direction).

The first portion TP is positioned under the data test pads 177*a*, 177*b*, 177*c*, 177*aa*, 177*bb*, and 177*cc* and may extend substantially parallel to each of the rows RO1, RO2, and RO3.

The third portions LP2 connect the first portions TP of the connection lines 176*a*, 176*b*, and 176*c* with the data test pads 177*a*, 177*b*, and 177*c* positioned at the middle of one fan-out region.

The second portions LP1 connect the data test pads 177*aa*, 177*bb*, and 177*cc* positioned at the edge of the fan-out region with the first portions TP of the connection lines 176*a*, 176*b*, and 176*c*. The second portions LP1 may extend substantially in the second direction D2 (e.g., the column direction). For example, the width W1 of the second portions LP1 of the connection lines 176*a*, 176*b*, and 176*c* may be larger than the width W2 of the first portions TP and the width W3 of the third portions LP2.

The gate conductor may include a conductive material such as a metal. The gate conductor may be formed by using one photomask.

A gate insulating layer 140 including an organic insulating material or an inorganic insulating material is positioned on the gate conductor.

A plurality of data conductors including a shorting bar SBLa, SBLb, or SBLc are formed on the gate insulating layer 140. FIG. 2 shows three shorting bars SBLa, SBLb, and SBLc. The number of shorting bars SBLa, SBLb, and SBLc may be the same as the number of the rows RO1, RO2, and RO3 in which the data test pads 177*a*, 177*b*, 177*c*, 177*aa*, 177*bb*, and 177*cc* are arranged.

The shorting bars SBLa, SBLb, and SBLc may extend substantially in the first direction D1 (e.g., the row direction) and may be parallel to each other. The shorting bars SBLa, SBLb, and SBLc, respectively, are positioned corresponding to the rows RO1, RO2, and RO3 and cross the data test pads 177*a*, 177*b*, 177*c*, 177*aa*, 177*bb*, and 177*cc* of the rows RO1, RO2, and RO3.

The shorting bars SBLa, SBLb, and SBLc may cross and overlap the second portions LP1 of the connection lines 176*a*, 176*b*, and 176*c* via an insulating layer such as the gate insulating layer 140.

The data conductor may include a conductive material such as a metal. The data conductor may be formed by using the same photomask.

A deposition position of the shorting bars SBLa, SBLb, and SBLc may be exchanged with a deposition position of a plurality of data leads 178, a plurality of data test pads 177*a*, 177*b*, 177*c*, 177*aa*, 177*bb*, and 177*cc*, and a plurality of connection lines 176*a*, 176*b*, and 176*c*. For example, the shorting bars SBLa, SBLb, and SBLc may be formed of a gate conductor, and a plurality of data leads 178, a plurality of data test pads 177*a*, 177*b*, 177*c*, 177*aa*, 177*bb*, and 177*cc*, and a plurality of connection lines 176*a*, 176*b*, and 176*c* may be formed of a data conductor.

A passivation layer 180 including an organic insulating material or an inorganic insulating material is formed on the shorting bars SBLa, SBLb, and SBLc. The passivation layer 180 includes a plurality of contact holes 185 exposing the data test pads 177*aa*, 177*bb*, and 177*cc* positioned at the edge of one fan-out region, a plurality of contact holes 186 exposing the shorting bars SBLa, SBLb, and SBLc overlapping the data test pads 177*aa*, 177*bb*, and 177*cc*, at least one contact hole 187 exposing the data test pads 177*a*, 177*b*, and 177*c* positioned at the middle of the fan-out region, and at least one contact hole 188 exposing the shorting bars SBLa, SBLb, and SBLc overlapping the data test pads 177*a*, 177*b*, and 177*c*. The number of the contact holes 185 exposing one data test pads 177*aa*, 177*bb*, and 177*cc* may be larger than the number of the contact holes 187 exposing one of the data test pads 177*a*, 177*b*, and 177*c*. The number of a plurality of contact holes 186 exposing the shorting bars SBLa, SBLb, and SBLc overlapping one data test pad 177*aa*, 177*bb*, and 177*cc* may be larger than the number of the contact holes 188 exposing the shorting bars SBLa, SBLb, and SBLc overlapping one of the data test pads 177*a*, 177*b*, and 177*c*.

At least one of contact assistants 87*a*, 87*b*, and 87*c* is positioned on the passivation layer 180. FIG. 2 shows three contact assistants 87*a*, 87*b*, and 87*c* as an example. The number of the contact assistants 87*a*, 87*b*, and 87*c* may be the same as the number of the rows RO1, RO2, and RO3 in which the data test pads 177*a*, 177*b*, 177*c*, 177*aa*, 177*bb*, and 177*cc* are arranged.

The contact assistants 87*a*, 87*b*, and 87*c* may extend substantially in the first direction D1 (e.g., the row direction) and may be parallel to each other. The contact assistants 87*a*, 87*b*, and 87*c*, respectively, are positioned corresponding to the rows RO1, RO2, and RO3 and overlap the data test pads 177*a*, 177*b*, 177*c*, 177*aa*, 177*bb*, and 177*cc* of the rows RO1, RO2, and RO3.

The contact assistants 87*a*, 87*b*, and 87*c* electrically and physically connect the data test pads 177*a*, 177*b*, 177*c*, 177*aa*, 177*bb*, and 177*cc* positioned in the rows RO1, RO2, and RO3 with the shorting bars SBLa, SBLb, and SBLc overlapping the data test pads 177*a*, 177*b*, 177*c*, 177*aa*, 177*bb*, and 177*cc* through the contact holes 185, 186, 187, and 188 of the passivation layer 180.

The contact assistants 87*a*, 87*b*, and 87*c* may include a conductive material such as metal, or a transparent conductive material including ITO and IZO.

The same test signal is substantially simultaneously applied to the data lines 171 of a group through the shorting bars SBLa, SBLb, and SBLc and the data test pads 177*a*, 177*b*, 177*c*, 177*aa*, 177*bb*, and 177*cc*, testing the display panel 300. For example, according to an exemplary embodiment of the present invention, the same test signals may be respectively and independently applied to a group of the data lines 171 connected to the data test pads 177*a*, 177*b*, 177*c*, 177*aa*, 177*bb*, and 177*cc* positioned in the (3N−2)-th column from an edge of the fan-out region, a group of the data lines 171 connected to the data test pads 177*a*, 177*b*, 177*c*, 177*aa*, 177*bb*, and 177*cc* positioned in the (3N−1)-th column from the edge of the fan-out region, and a group of the data lines 171 connected to the data test pads 177*a*, 177*b*, 177*c*, 177*aa*, 177*bb*, and 177*cc* positioned in the 3N-th column from the edge of the fan-out region.

The data lines 171 of each group may be connected to the pixels PX representing the same primary color.

According to an exemplary embodiment of the present invention, among the data test pads 177*a*, 177*b*, 177*c*, 177*aa*, 177*bb*, and 177*cc* positioned in a fan-out region, the data test pads 177*aa*, 177*bb*, and 177*cc* positioned at the edge of the fan-out region are connected through the same shorting bars SBLa, SBLb, and SBLc to at least one data test pads 177*a*, 177*b*, and 177*c* positioned at the middle of the fan-out region. Even when the contact assistants 87*a*, 87*b*, and 87*c* connected to the data test pads 177*aa*, 177*bb*, and 177*cc* are burnt and opened by static electricity flowing to the contact assistants 87*a*, 87*b*, and 87*c* through other signal lines or patterns adjacent to the fan-out region, and thus, the data test pads 177*aa*, 177*bb*, and 177*cc* are separated from the shorting bars SBLa, SBLb, and SBLc, the data test pads 177*a*, 177*b*, and 177*c* are connected to the middle data test pads 177*a*, 177*b*, and 177*c* through the connection line 176*a*, 176*b*, and 176*c*, and thus, the same test signal may be applied to the data test pads 177*a*, 177*b*, 177*c*, 177*aa*, 177*bb*, and 177*cc*. Accordingly, whether there are defects in the display signal lines of the display panel 300 and the pixels PX connected to the display signal lines may be detected, a defect that has not been detected upon testing the display panel 300 may be prevented from occurring in a subsequent step.

According to an exemplary embodiment of the present invention, among a plurality of data test pads 177*a*, 177*b*, 177*c*, 177*aa*, 177*bb*, and 177*cc* positioned in a fan-out region, the area of at least one data test pad 177*aa*, 177*bb*, and 177*cc* positioned at the edge of the fan-out region is relatively larger than the area of the data test pads 177*a*, 177*b*, and 177*c* positioned at the middle of the fan-out region. Accordingly, the number of a plurality of contact holes 185 of the passivation layer 180 exposing the data test pads 177*aa*, 177*bb*, and 177*cc* positioned at the edge of the fan-out region and a plurality of contact holes 186 exposing the shorting bars SBLa, SBLb, and SBLc may be increased. Thus, even when the contact assistants 87*a*, 87*b*, and 87*c* connected to the data test pads 177*aa*, 177*bb*, and 177*cc* are damaged by static electricity flowing in from the outside, the data test pads 177*aa*, 177*bb*, and 177*c* are less likely to be separated from the shorting bars SBLa, SBLb, and SBLc corresponding to the data test pads 177*aa*, 177*bb*, and 177*cc*.

According to an exemplary embodiment of the present invention, the second portions LP1 of the connection lines 176*a*, 176*b*, and 176*c* overlap their respective corresponding shorting bars SBLa, SBLb, and SBLc, forming parasitic capacitors Cap. The parasitic capacitors Cap may trap static electricity. The width W1 of the second portions LP1 may be increased, trapping more static electricity. Accordingly, the contact assistants 87*a*, 87*b*, and 87*c* connected to the data test pads 177*a*, 117*b*, 177*c*, 177*aa*, 177*bb*, and 177*cc* may be prevented from being damaged by the static electricity.

The structure of the data test pads 177*a*, 117*b*, 177*c*, 177*aa*, 177*bb*, and 177*cc* and the surroundings thereof may be applied to the gate test pads connected to the end portions 129 of the gate lines 121 and the surroundings thereof.

Figure 4:
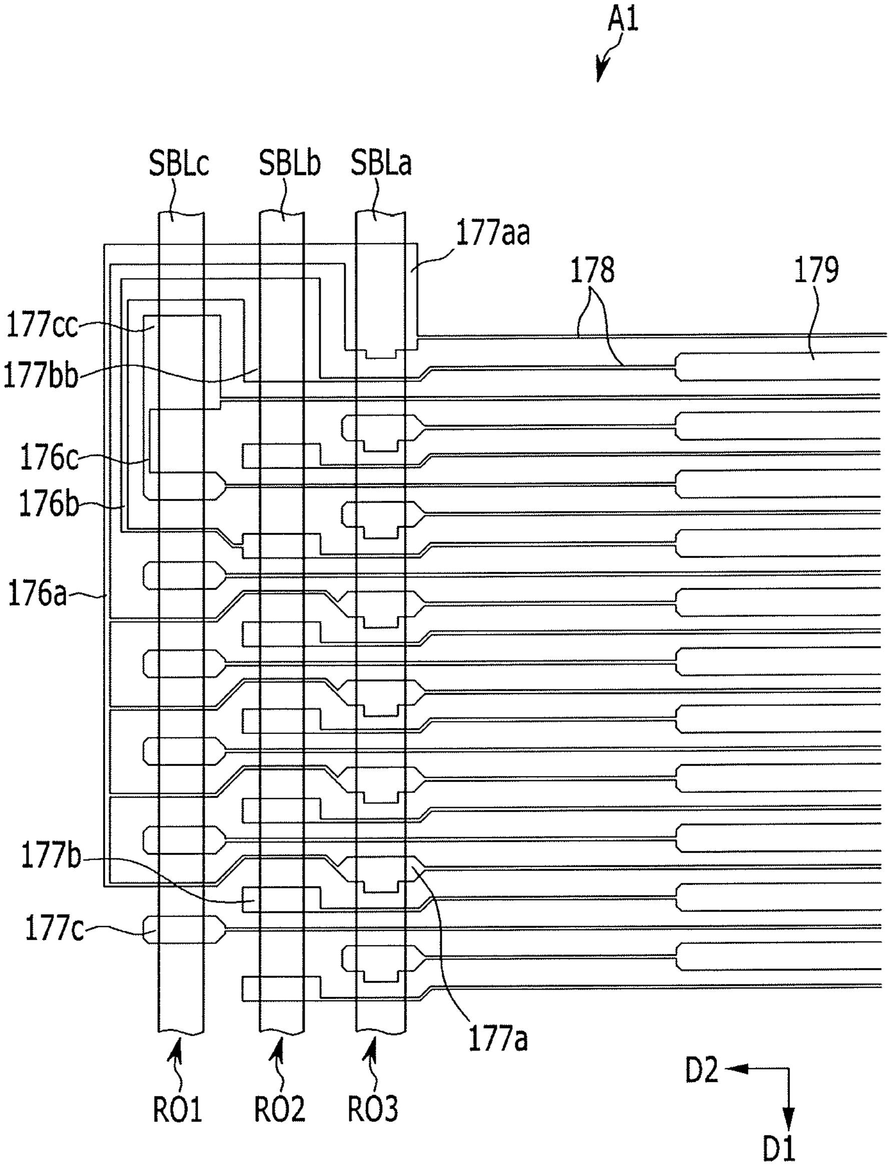
FIG. 4 is an enlarged layout view of a portion 'A1' of a display panel shown in FIG. 1, according to an exemplary embodiment of the present invention.
Figure 5:
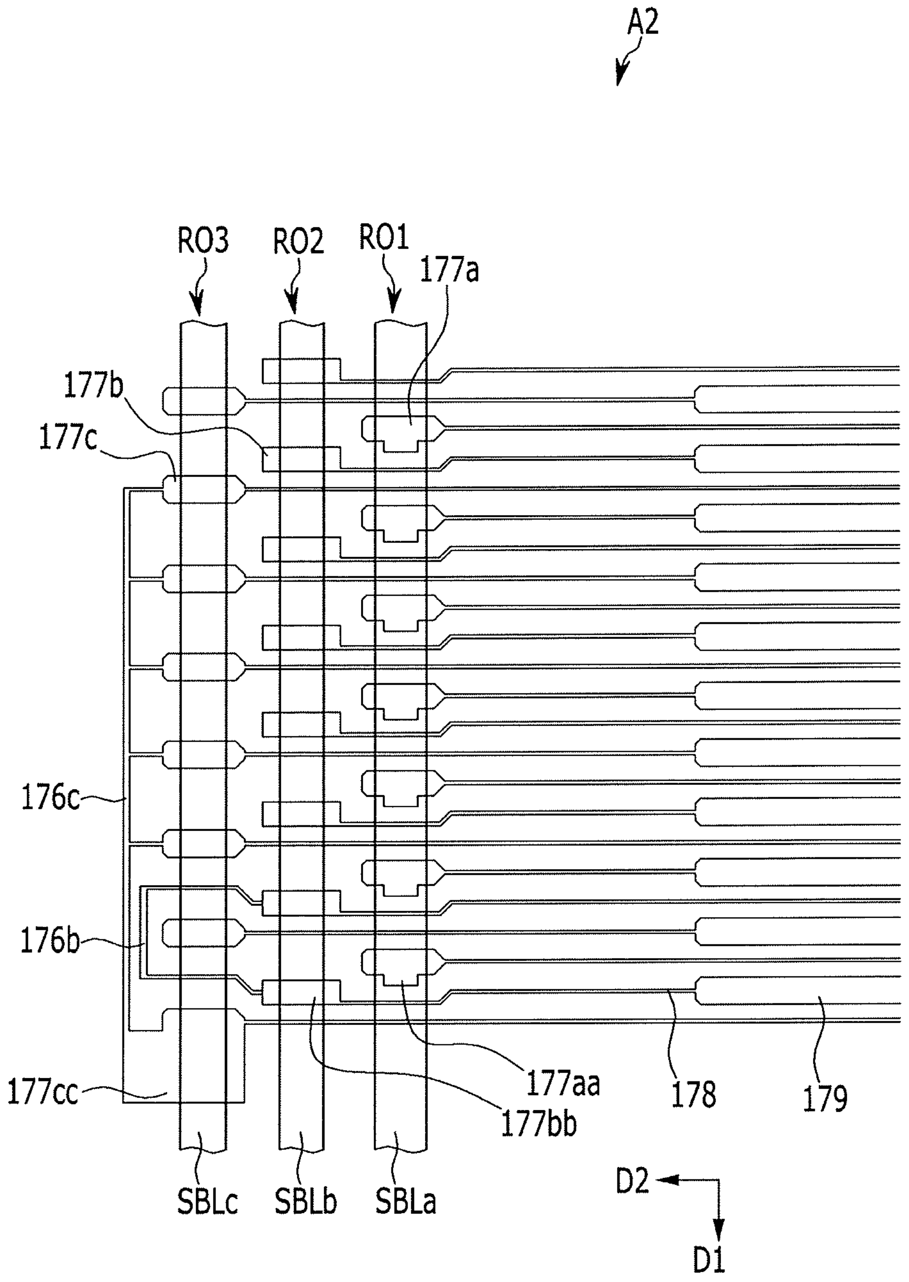
FIG. 5 is an enlarged layout view of a portion 'A2' of a display panel shown in FIG. 1, according to an exemplary embodiment of the present invention.
Figure 6:
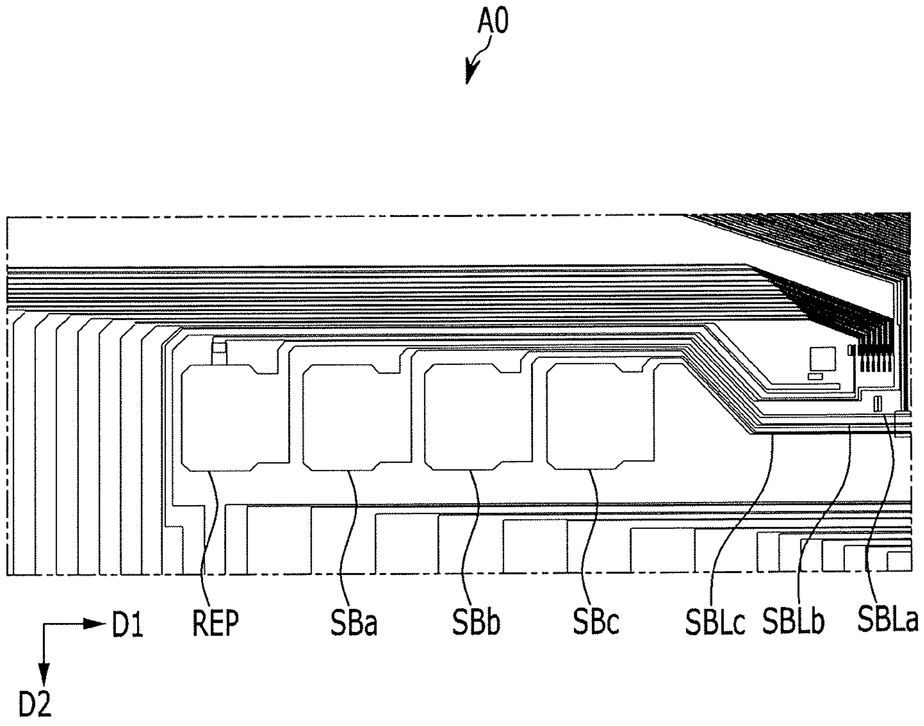
FIG. 6 is an enlarged layout view of a portion 'A0' of a display panel shown in FIG. 1, according to an exemplary embodiment of the present invention.
Figure 7:
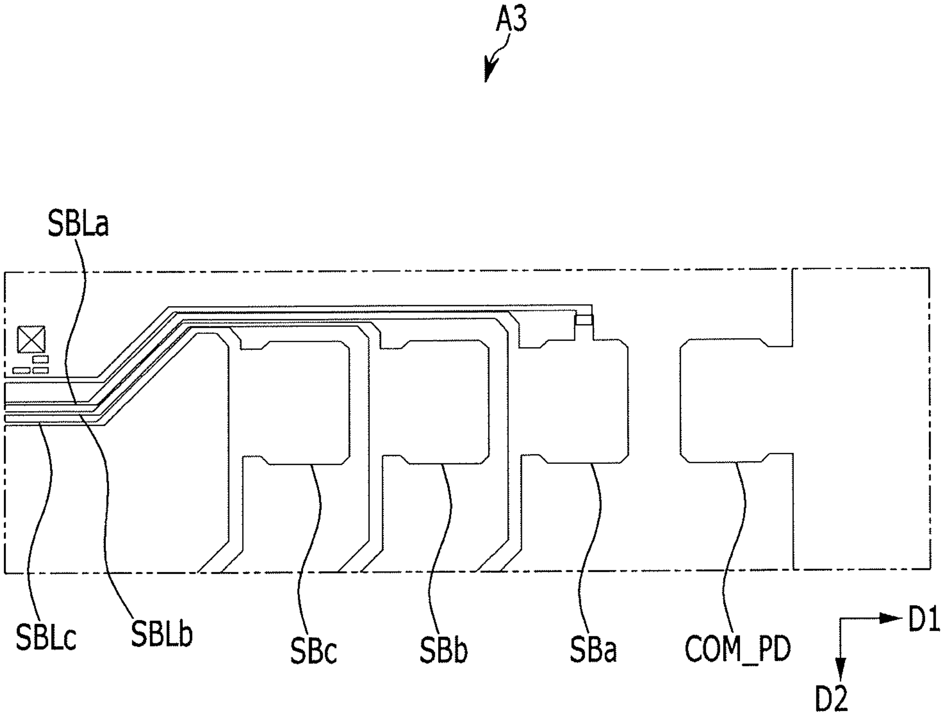
FIG. 7 is an enlarged layout view of a portion 'A3' of a display panel shown in FIG. 1, according to an exemplary embodiment of the present invention.
Figure 8:
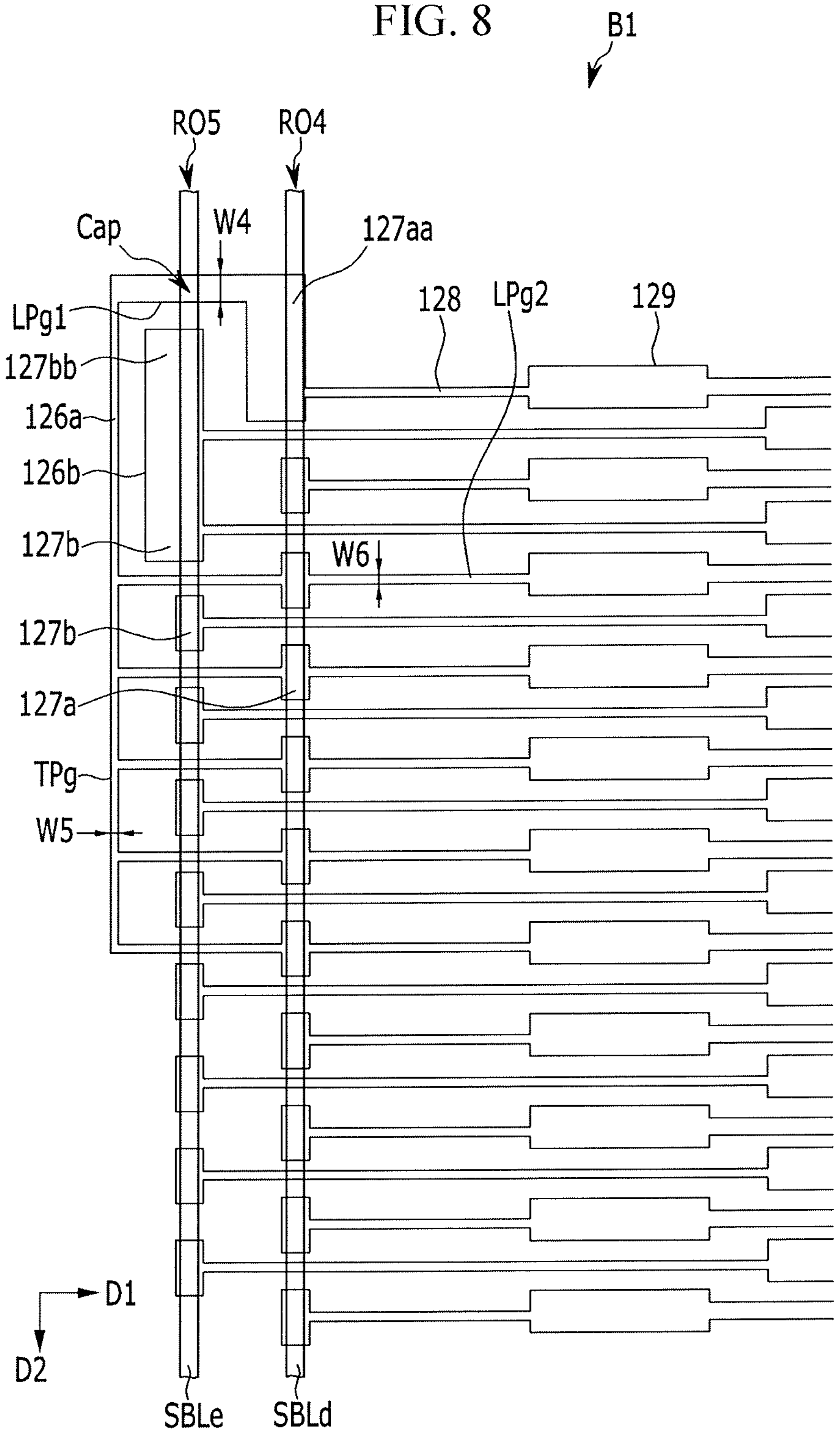
FIG. 8 is an enlarged layout view of a portion 'B1' of a display panel shown in FIG. 1, according to an exemplary embodiment of the present invention.
Figure 9:
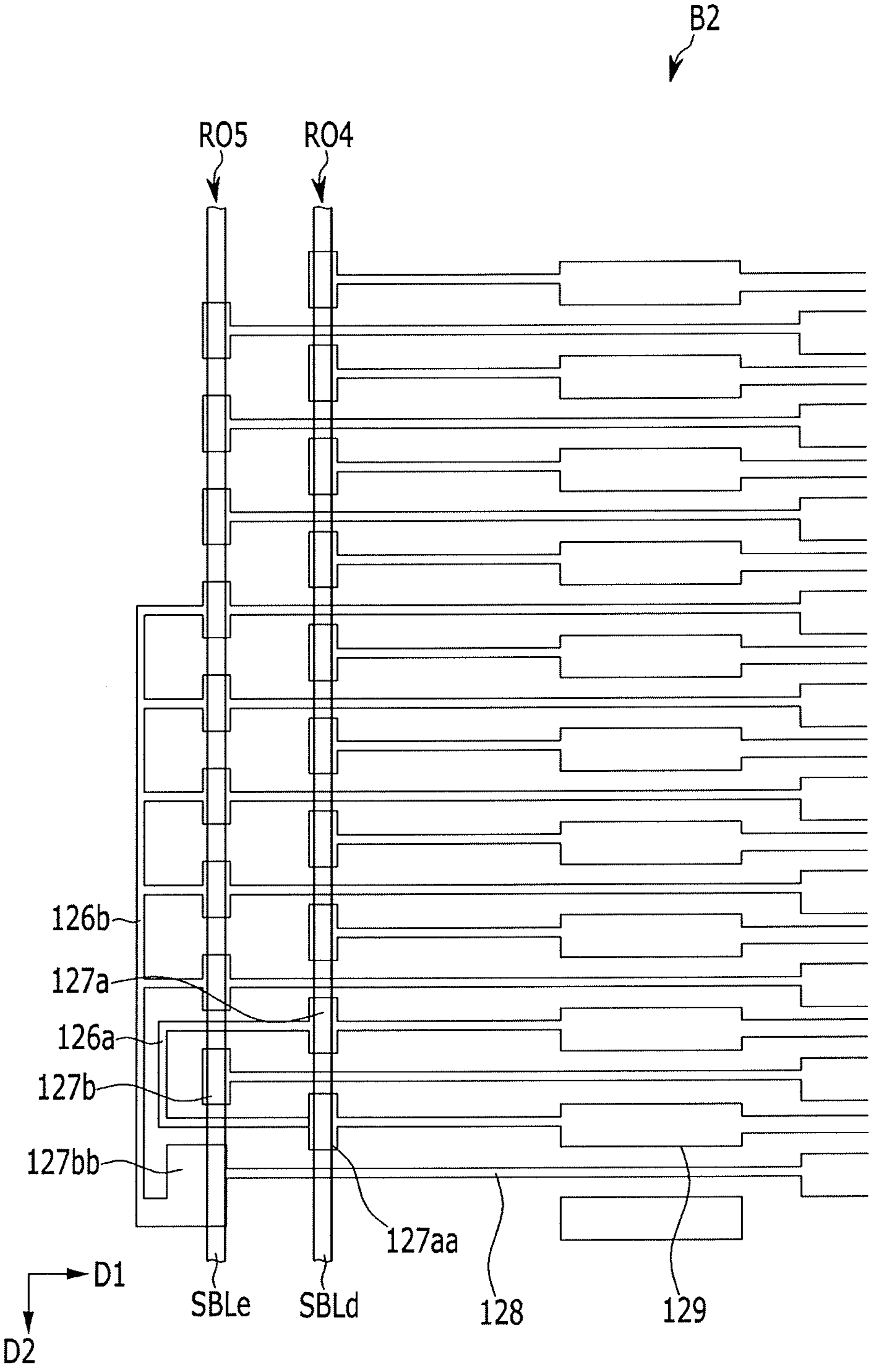
FIG. 9 is an enlarged layout view of a portion 'B2' of a display panel shown in FIG. 1, according to an exemplary embodiment of the present invention.
Figure 10:
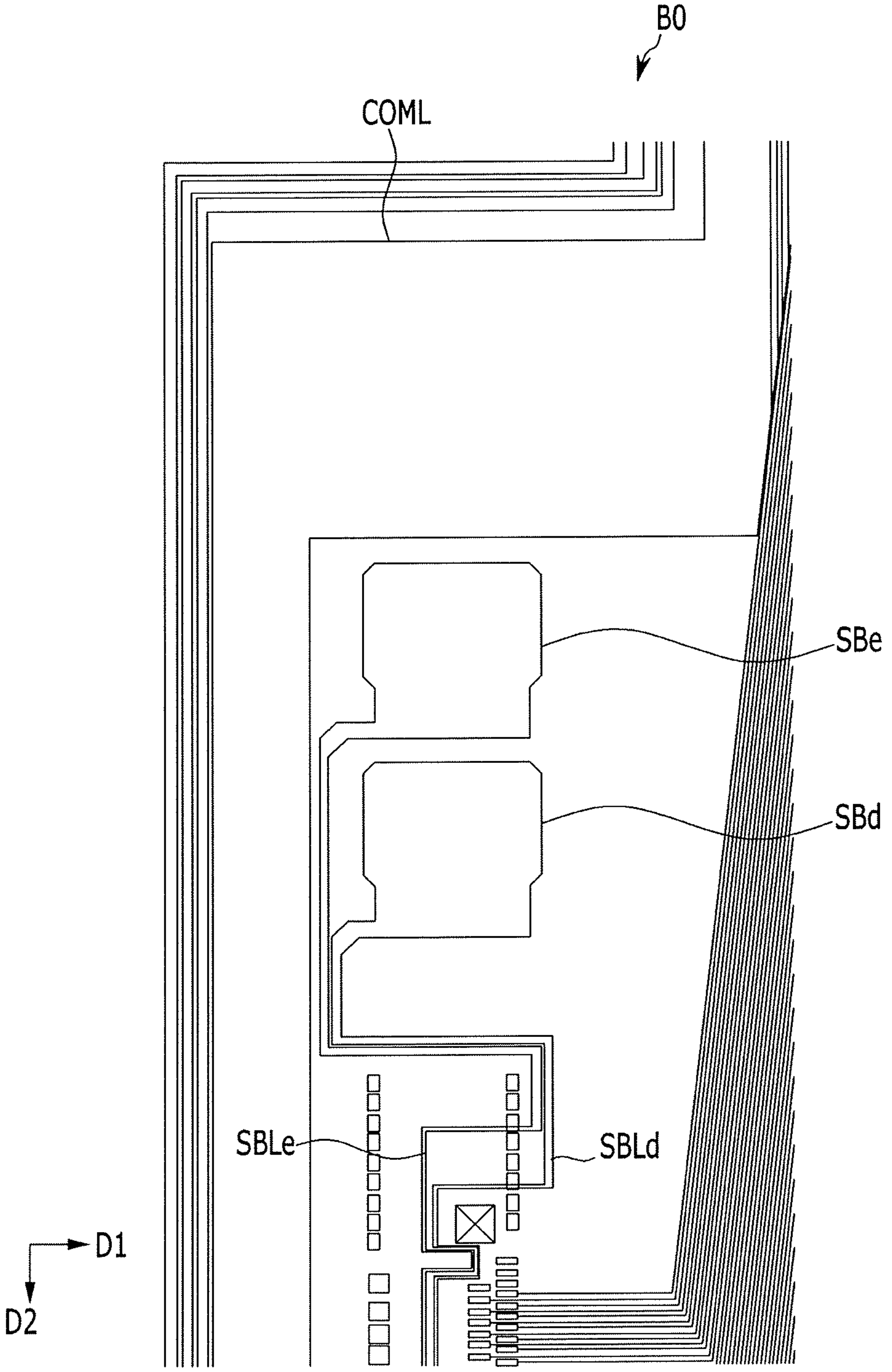
FIG. 10 is an enlarged layout view of a portion 'B0' of a display panel shown in FIG. 1, according to an exemplary embodiment of the present invention.

FIG. 4 is an enlarged layout view of a portion 'A1' of a display panel shown in FIG. 1, according to an exemplary embodiment of the present invention. FIG. 5 is an enlarged layout view of a portion 'A2' of a display panel shown in FIG. 1, according to an exemplary embodiment of the present invention. FIG. 6 is an enlarged layout view of a portion 'A0' of a display panel shown in FIG. 1, according to an exemplary embodiment of the present invention. FIG. 7 is an enlarged layout view of a portion 'A3' of a display panel shown in FIG. 1, according to an exemplary embodiment of the present invention. FIG. 8 is an enlarged layout view of a portion 'B1' of a display panel shown in FIG. 1, according to an exemplary embodiment of the present invention. FIG. 9 is an enlarged layout view of a portion 'B2' of a display panel shown in FIG. 1, according to an exemplary embodiment of the present invention. FIG. 10 is an enlarged layout view of a portion 'B0' of a display panel shown in FIG. 1, according to an exemplary embodiment of the present invention.

Referring to FIG. 4, the structure of the data test pads 177*a*, 177*b*, 177*c*, 177*aa*, 177*bb*, and 177*cc* positioned at a first side of a fan-out region among a plurality of data test pads 177*a*, 177*b*, 177*c*, 177*aa*, 177*bb*, and 177*cc* positioned in the fan-out region may be substantially the same as the structure of the data test pads 177*a*, 177*b*, 177*c*, 177*aa*, 177*bb*, and 177*cc* described above in connection with FIG. 2 and FIG. 3.

Referring to FIG. 5, the structure of the data test pads 177*a*, 177*b*, 177*c*, 177*aa*, 177*bb*, and 177*cc* positioned at a second side of a fan-out region among a plurality of data test pads 177*a*, 177*b*, 177*c*, 177*aa*, 177*bb*, and 177*cc* positioned in the fan-out region may be substantially the same or may be different from the structure of the data test pads 177*a*, 177*b*, 177*c*, 177*aa*, 177*bb*, and 177*cc* positioned at the first side. FIG. 6 shows an example where the data test pads 177*a*, 177*b*, 177*c*, 177*aa*, 177*bb*, and 177*cc* positioned at the second side differ in structure from the data test pads 177*a*, 177*b*, 177*c*, 177*aa*, 177*bb*, and 177*cc* positioned at the first side.

For example, an outermost data test pad 177*cc* among a plurality of data test pads 177*a*, 177*b*, 177*c*, 177*aa*, 177*bb*, and 177*cc* in the fan-out region is wider than the data test pads 177*a*, 177*b*, and 177*c* positioned at the middle of the fan-out region. The expanded data test pad 177*c* may be positioned in the third row RO3 as shown in FIG. 5. However, exemplary embodiments of the present invention are not limited thereto, and the expanded data test pad 177*c* may be positioned in the first row RO1 or the second row RO2.

The outermost data test pad 177*cc* among the data test pads 177*aa*, 177*bb*, and 177*cc* positioned at the edge of the fan-out region may be connected to the data test pad 177*c* positioned at the middle of the fan-out region through the connection line 176*c*. The number of the data test pads 177*c* connected to the data test pad 177*cc* through the connection line 176*c* and positioned at the middle of the fan-out region may be about 5 to 7, but is not limited thereto. The data test pads 177*c* connected to each other and positioned at the middle of the fan-out region may be sequentially disposed.

When other signal lines, other pads, or patterns are spaced apart from the connection lines 176*c* in such an extent that static electricity is less likely to flow in, for example, when a gap between the connection lines 176*c* and the other signal lines, the other pads, or patterns disposed thereunder is large enough to prevent static electricity from flowing in, the outermost data test pad 177*cc* in the fan-out region may be connected to the data test pad 177*d* positioned substantially at the middle one of the fan-out region through the connection line 176*d* or may be connected to all of the data test pads 177*d* positioned at the middle of the fan-out region.

Among the data test pads 177*aa*, 177*bb*, and 177*cc* positioned at the edge of the fan-out region, the data test pad 177*bb* may be connected to the adjacent data test pad 177*b* through the connection line 176*b*. The number of the data test pads 177*b* connected to the data test pad 177*bb* through the connection line 176*b* and positioned at the middle of the fan-out region may be one.

As shown in FIG. 5, the area of the data test pad 177*bb* may be substantially the same as the area of the data test pad 177*b* positioned at the middle of the fan-out region. Alternatively, the data test pad 177*bb* may have a larger area than the data test pad 177*b* positioned at the middle of the fan-out region. The area of the data test pad 177*aa* may be substantially the same or larger than the area of the data test pad 177*a* positioned at the middle of the fan-out region.

The shorting bars SBLa, SBLb, and SBLc shown in FIG. 4 and FIG. 5 are substantially the same as the shorting bars SBLa, SBLb, and SBLc described above in connection with FIG. 2.

Referring to FIG. 6 and FIG. 7, the shorting bars SBLa, SBLb, and SBLc are connected to at least one of test signal input pads (inspection pads) SBa, SBb, and SBc positioned at one or both sides of the data test pads 177*a*, 177*b*, 177*c*, 177*aa*, 177*bb*, and 177*cc* and receive the test signal through the test signal input pads SBa, SBb, and SBc. As shown in FIG. 6 and FIG. 7, three test signal input pads SBa, SBb, and SBc, respectively, are positioned near each of two opposite sides of the data test pads 177*a*, 177*b*, 177*c*, 177*aa*, 177*bb*, and 177*cc*. The test signal input pads SBa, SBb, and SBc may be arranged substantially in the first direction D1.

A repair pad REP that applies a test signal to its corresponding data line 171 after a ring repair of the data line 171 or a common voltage pad COM_PD that applies a common voltage Vcom to the common voltage line COML may be positioned near the test signal input pads SBa, SBb, and SBc.

As shown in FIG. 6 and FIG. 7, several other signal lines or patterns are positioned near the data test pads 177*a*, 177*b*, 177*c*, 177*aa*, 177*bb*, and 177*cc* or the test signal input pads SBa, SBb, and SBc positioned in a fan-out region, and static electricity may flow into the contact assistants 87*a*, 87*b*, and 87*c* connected to the data test pads 177*aa*, 177*bb*, and 177*cc* positioned at the edge one of the fan-out region. However, according to an exemplary embodiment of the present invention, as described above, a defect due to static electricity may be reduced.

Referring to FIG. 8 and FIG. 9, a plurality of gate lead lines 128, a plurality of gate test pads 127*a*, 127*b*, 127*aa*, and 127*bb*, and a plurality of connection lines 126*a* and 126*b* may be positioned on an insulation substrate (not shown). The plurality of gate lead lines 128, the plurality of gate test pads 127*a*, 127*b*, 127*aa*, and 127*bb*, and the plurality of connection lines 126*a* and 126*b* may be included in a plurality of gate conductors or a plurality of data conductors.

The gate lead line 128 physically and electrically connects the end portion 129 of the gate line 121 of the fan-out region with the gate test pads 127*a*, 127*b*, 127*aa*, and 127*bb*. The gate lead line 128 may extend substantially in the first direction D1 (e.g., the row direction).

A plurality of gate test pads 127*a*, 127*b*, 127*aa*, and 127*bb* may be arranged in at least one column. As shown in FIG. 8 and FIG. 9, a plurality of gate test pads 127*a*, 127*b*, 127*aa*, and 127*bb* are alternately arranged in two columns RO4 and RO5. The gate test pads 127*a*, 127*b*, 127*aa*, and 127*bb* positioned in the (2N−1)-th (N is a natural number of 1 or more) column starting from a side edge of a fan-out region are positioned in a first column RO4, and the gate test pads 127*a*, 127*b*, 127*aa*, and 127*bb* positioned in the (2N)-th column starting from the side edge of the fan-out region may be sequentially positioned in the second column RO5. However, the number of the columns RO4 and RO5 is not limited thereto.

According to an exemplary embodiment of the present invention, among a plurality of gate test pads 127*a*, 127*b*, 127*aa*, and 127*bb* positioned in a fan-out region, at least one of gate test pads 127*aa* and 127*bb* positioned at the upper and lower sides of the fan-out region are extended and thus has a greater area than the gate test pads 127*a* and 127*b* positioned at the middle of the fan-out region. The at least one of gate test pads 127_aa_ and 127_bb_ is expanded by about 1.5 times to about 5 times as compared with the gate test pads 127_a_ and 127_b_, but exemplary embodiments of the present invention are not limited thereto. Referring to FIG. 8, the gate test pads 127_aa_ and 127_bb_ positioned at the edge of the fan-out region are expanded, and referring to FIG. 9, the outermost gate test pad 127_bb_ is expanded, but the gate test pad 127_aa_ is not expanded.

According to an exemplary embodiment of the present invention, at least one of the gate test pads 127_aa_ and 127_bb_ positioned at the edge of the fan-out region may be connected to the gate test pad 127_a_ and 127_b_ positioned at the middle of the fan-out region through the connection lines 126_a_ and 126_b_.

As shown in FIG. 8 and FIG. 9, the outermost gate test pad 127_aa_ or 127_bb_ is connected to at least one of gate test pads 127_a_ and 127_b_ positioned at the middle of the fan-out region through the connection lines 126_a_ and 127_b_, and the second outermost gate test pad 127_bb_ or 127_aa_ is connected to at least one of gate test pads 127_a_ and 127_b_ positioned at the middle of the fan-out region through the connection lines 126_a_ and 126_b_. The gate test pads 127_a_ and 127_b_ connected to the gate test pads 127_aa_ and 127_bb_ positioned at the edge of the fan-out region may be the gate test pads 127_a_ and 127_b_ sequentially positioned from the upper and lower side edges of one fan-out region.

The outermost gate test pad of the gate test pads 127_aa_ and 127_bb_ positioned at the edge may be connected to a plurality of gate test pads 127_a_ and 127_b_. Two or more (e.g., five or seven, but not limited thereto) gate test pads 127_a_ and 127_b_ connected to the outermost gate test pad 127_aa_ or 127_bb_ may be sequentially positioned from the upper or lower edge of a fan-out region.

When other signal lines, other pads, or patterns are spaced apart from the connection lines 126_a_ and 126_b_ in such an extent that static electricity is less likely to flow in, for example, when a gap between the connection lines 126_a_ and 126_b_ and the other signal lines, the other pads, or patterns disposed adjacent to the connection lines 126_a_ and 126_b_ is large enough to prevent static electricity to flow in, the outermost gate test pad 127_aa_ or 127_bb_ of a fan-out region may be connected to the gate test pads 127_a_ and 127_b_ positioned at the middle of the fan-out region through the connection lines 126_a_ and 126_b_ or may be connected to all of the gate test pads 127_a_ and 127_b_ positioned at the middle of the fan-out region.

The second outermost gate test pad 127_bb_ or 127_aa_ of the fan-out region may be connected to an adjacent one of the gate test pads 127_a_ and 127_b_ positioned at the middle of the fan-out region through the connection lines 126_a_ and 126_b_.

Referring to FIG. 8, the adjacent gate test pad 127_b_ connected to the gate test pad 127_bb_ positioned at an edge of a fan-out region through a connection line 126_b_ may be expanded as compared with the gate test pads 127_b_ positioned at a middle of the fan-out region, and the connection line 126_b_ may be expanded as compared with other connection lines 126_a_. For example, as shown in FIG. 8, right and left widths of the gate test pad 127_bb_, the adjacent gate test pad 127_b_ connected to the gate test pad 127_bb_ through the connection line 126_b_, and the connection line 126_b_ may be substantially the same. Accordingly, the gate test pad 127_bb_, the connection line 126_b_, and the gate test pad 127_b_ connected to each other form a quadrangle, for example, a rectangular plane shape. However, the shape of the gate test pad 127_bb_, the connection line 126_b_, and the gate test pad 127_b_ connected to each other is not limited thereto.

The connection lines 126_a_ and 126_b_ include a first portion TPg extending in the second direction D2, and a second portion LPg1 and a third portion LPg2 extending in the first direction D1.

The first portions TPg are positioned at the side of the gate test pads 127_a_, 127_b_, 127_aa_, and 127_bb_ and may extend substantially parallel to each column RO4 and RO5.

The third portions LPg2 connect the first portions TPg of the connection lines 126_a_ and 126_b_ with the gate test pads 127_a_ and 127_b_ positioned at the middle of one fan-out region.

The second portions LPg1 connect the gate test pads 127_aa_ and 127_bb_ positioned at the edge of the fan-out region with the first portions TPg of the connection lines 126_a_ and 126_b_ and may extend substantially in the first direction D1. The width W4 of the second portions LPg1 of the connection lines 126_a_ and 126_b_ may be larger than the width W5 of the first portions TPg and the width W6 of the third portions LPg2.

At least one shorting bar SBLd or SBLe may be positioned on the insulation substrate. When a plurality of gate lead lines 128, a plurality of gate test pads 127_a_, 127_b_, 127_aa_, and 127_bb_, and a plurality of connection lines 126_a_ and 126_b_ are formed of gate conductors, the shorting bars SBLd and SBLe may be included in a plurality of data conductors, and when the plurality of gate lead lines 128, the plurality of gate test pads 127_a_, 127_b_, 127_aa_, and 127_bb_, and the plurality of connection lines 126_a_ and 126_b_ are formed of data conductors, the shorting bars SBLd and SBLe may be included in a plurality of gate conductors. A gate insulating layer (not shown) is positioned between the gate conductor and the data conductor.

FIG. 8 and FIG. 9 show two shorting bars SBLd and SBLe. The number of the shorting bars SBLd and SBLe may be the same as the number of the columns RO4 and RO5 where the gate test pads 127_a_, 127_b_, 127_aa_, and 127_bb_ are arranged.

The shorting bars SBLd and SBLe may extend substantially in the second direction D2 and may be parallel to each other. The shorting bars SBLd and SBLe, respectively, are positioned corresponding to the columns RO4 and RO5, and cross the gate test pads 127_a_, 127_b_, 127_aa_, and 127_bb_ of the columns RO4 and RO5.

The shorting bars SBLd and SBLe may cross the second portions LPg1 of the connection lines 126_a_ and 126_b_, and the shorting bars SBLd and SBLe may overlap the second portions LPg1 of the connection lines 126_a_ and 126_b_ via the insulating layer such as the gate insulating layer.

A passivation layer (not shown) is positioned on the shorting bars SBLd and SBLe, and the passivation layer may include a plurality of contact holes exposing the gate test pads 127_aa_ and 127_bb_ positioned at the edge of a fan-out region, a plurality of contact holes exposing the shorting bars SBLd and SBLe overlapping the gate test pads 127_aa_ and 127_bb_, at least one contact hole exposing the gate test pads 127_a_ and 127_b_ positioned at the middle of the fan-out region, and at least one contact hole exposing the shorting bars SBLd and SBLc overlapping the gate test pads 127_a_ and 127_b_. The number of the contact holes exposing one of the gate test pads 127_aa_ and 127_bb_ may be larger than the number of the contact holes exposing one of the gate test pads 127_a_ and 127_b_. The number of a plurality of contact holes exposing the shorting bars SBLd and SBLe overlapping one of the gate test pads 127_aa_ and 127_bb_ may be larger than the number of the contact holes exposing the shorting bars SBLd and SBLe overlapping one of the gate test pads 127_a_ and 127_b_.

At least one contact assistant (not shown) is positioned on the passivation layer, and the number of the contact assistants may be the same as the number of the columns RO4 and RO5 where the gate test pads 127*a*, 127*b*, 127*aa*, and 127*bb* are arranged.

The contact assistants may extend substantially in the second direction D2, and the contact assistants are parallel to each other. The contact assistants respectively correspond to the columns RO4 and RO5, and the contact assistants overlap the gate test pads 127*a*, 127*b*, 127*aa*, and 127*bb* of each of the columns RO4 and RO5.

The contact assistants physically and electrically connect the gate test pads 127*a*, 127*b*, 127*aa*, and 127*bb* positioned in each of the columns RO4 and RO5 with the shorting bars SBLd and SBLe through a plurality of contact holes of the passivation layer.

The same test signal may be substantially simultaneously applied to the gate lines 121 of a group through the shorting bars SBLd and SBLe and the gate test pads 127*a*, 127*b*, 127*aa*, and 127*bb*, testing the display panel 300. For example, according to an exemplary embodiment of the present invention, the same test signals may be respectively and independently applied to a group of the gate lines 121 connected to the gate test pads 127*a*, 127*b*, 127*aa*, and 127*bb* positioned in the (2N−1)-th column from a side edge of the fan-out region and a group of the gate lines 121 connected to the gate test pads 127*a*, 127*b*, 127*aa*, and 127*bb* positioned in the (2N)-th column from the side edge of the fan-out region.

According to an exemplary embodiment of the present invention, among the gate test pads 127*a*, 127*b*, 127*aa*, and 127*bb* positioned in a fan-out region, the gate test pads 127*aa* and 127*bb* positioned at the edge of the fan-out region are connected through the same shorting bars SBLd and SBLe to at least one of gate test pads 127*a* and 127*b* positioned at the middle of the fan-out region. Even when the contact assistants connected to the gate test pads 127*aa* and 127*bb* are damaged by static electricity flowing in through other signal lines or patterns adjacent to the fan-out region, and thus, the gate test pads 127*aa* and 127*bb* are separated from the shorting bars SBLd and SBLe, the gate test pads 127*a* and 127*b* are connected to the middle gate test pads 127*a* and 127*b* through the connection lines 126*a* and 126*b*, and thus, the same test signal may be applied to the gate test pads 127*a* and 127*b*. Accordingly, whether there are defects in the display signal lines of the display panel 300 and the pixels PX connected to the display signal lines may be detected, a defect that has not detected upon testing the display panel 300 may be prevented from occurring in a subsequent step.

According to an exemplary embodiment of the present invention, among a plurality of gate test pads 127*a*, 127*b*, 127*aa*, and 127*bb* positioned in a fan-out region, the area of at least one of gate test pads 127*aa* and 127*bb* positioned at the edge of the fan-out region is relatively larger than the area of the gate test pads 127*a* and 127*b* positioned at the middle of the fan-out region. Accordingly, the number of a plurality of contact holes of the passivation layer 180 exposing the gate test pads 127*aa* and 127*bb* positioned at the edge of the fan-out region and a plurality of contact hole exposing the shorting bars SBLd and SBLe may be increased. Thus, even when the contact assistants connected to the gate test pads 127*aa* and 127*bb* are damaged by static electricity flowing in from the outside, the gate test pads 127*aa* and 127*bb* are less likely to be separated from the shorting bars SBLd and SBLe corresponding to the gate test pads 127*aa* and 127*bb*.

According to an exemplary embodiment of the present invention, the second portions LP1 of the connection lines 126*a* and 126*b* overlap their respective corresponding shorting bars SBLd and SBLe, forming parasitic capacitors Cap. The parasitic capacitors Cap may trap static electricity. The width W4 of the second portions LP1 may be increased, trapping more static electricity. Accordingly, the contact assistants connected to the gate test pads 127*a*, 127*b*, 127*aa*, and 127*bb* may be prevented from being damaged by the static electricity.

Referring to FIG. 10, the shorting bars SBLd and SBLe are connected to at least one test signal input pad SBd and SBe positioned at one or both sides near the gate test pads 127*a*, 127*b*, 127*aa*, 127*bb* and receive the test signal through the test signal input pads SBd and SBe. The test signal input pads SBd and SBe may be arranged substantially in the second direction D2.

A common voltage line COML may be positioned near the test signal input pads SBd and SBe, for example.

Figure 11:
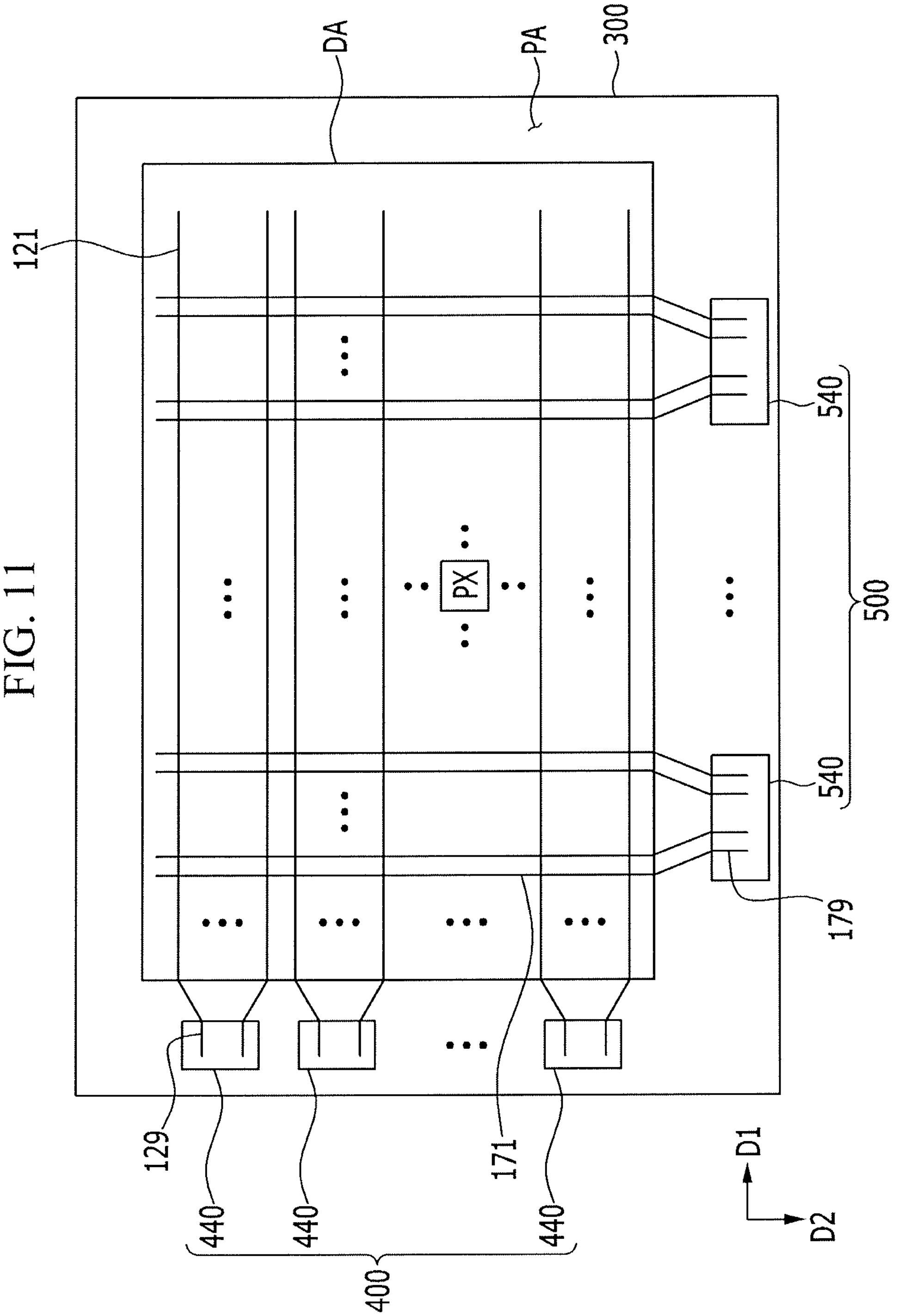
FIG. 11 to FIG. 13 are layout views of a display device according to an exemplary embodiment of the present invention.
Figure 12:
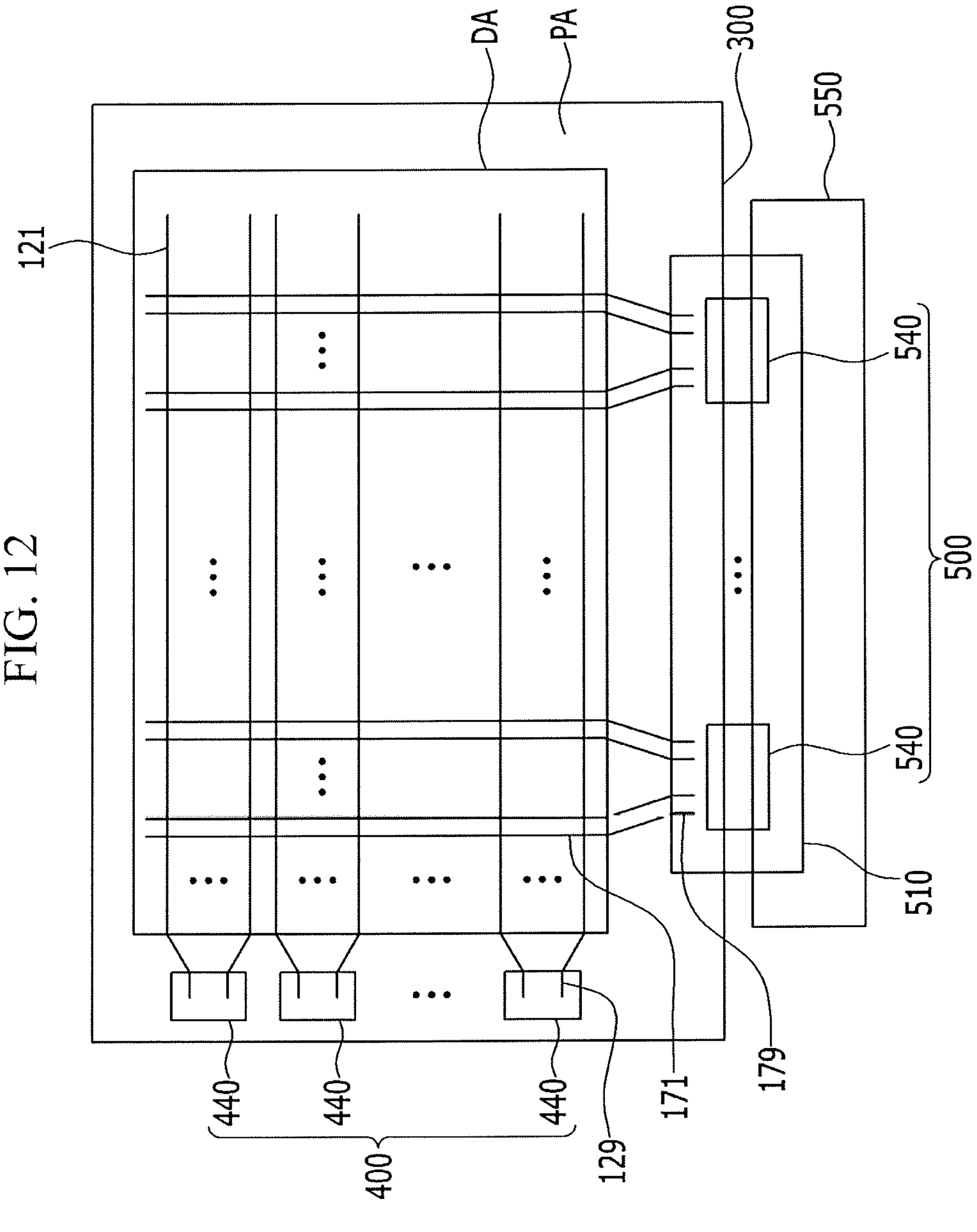
Figure 13:
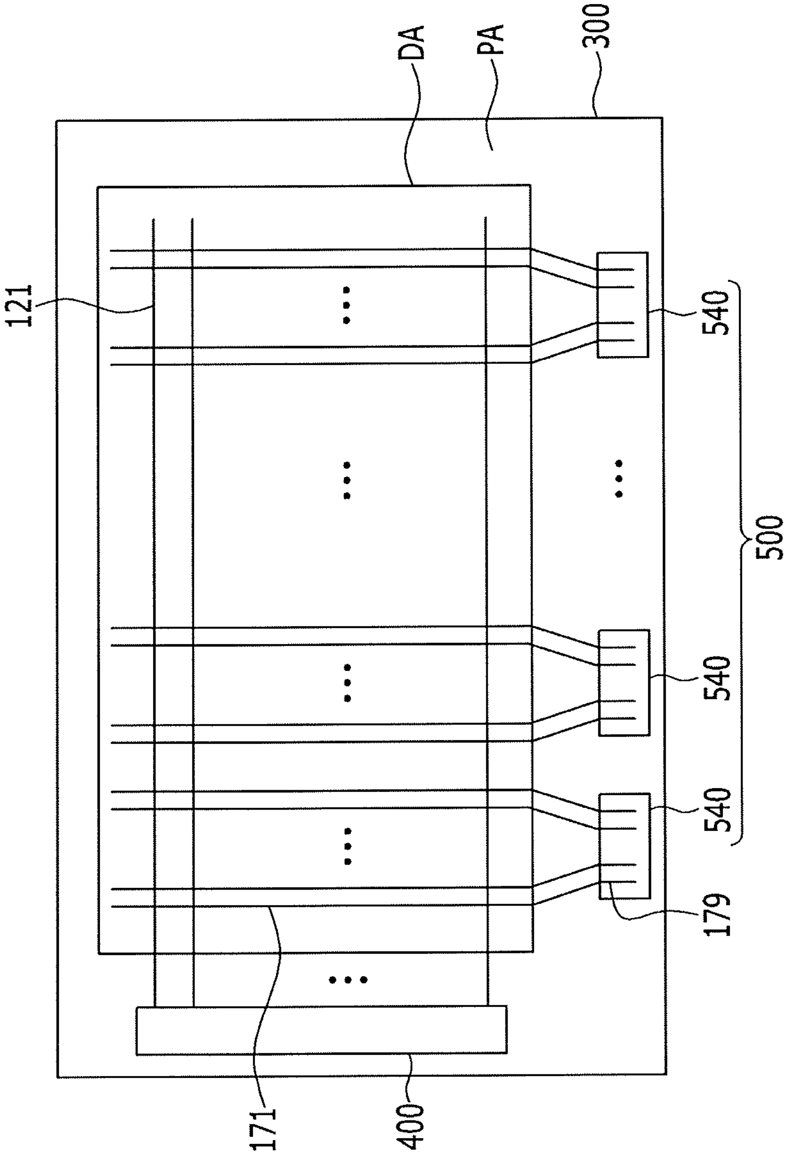
Figure 14:
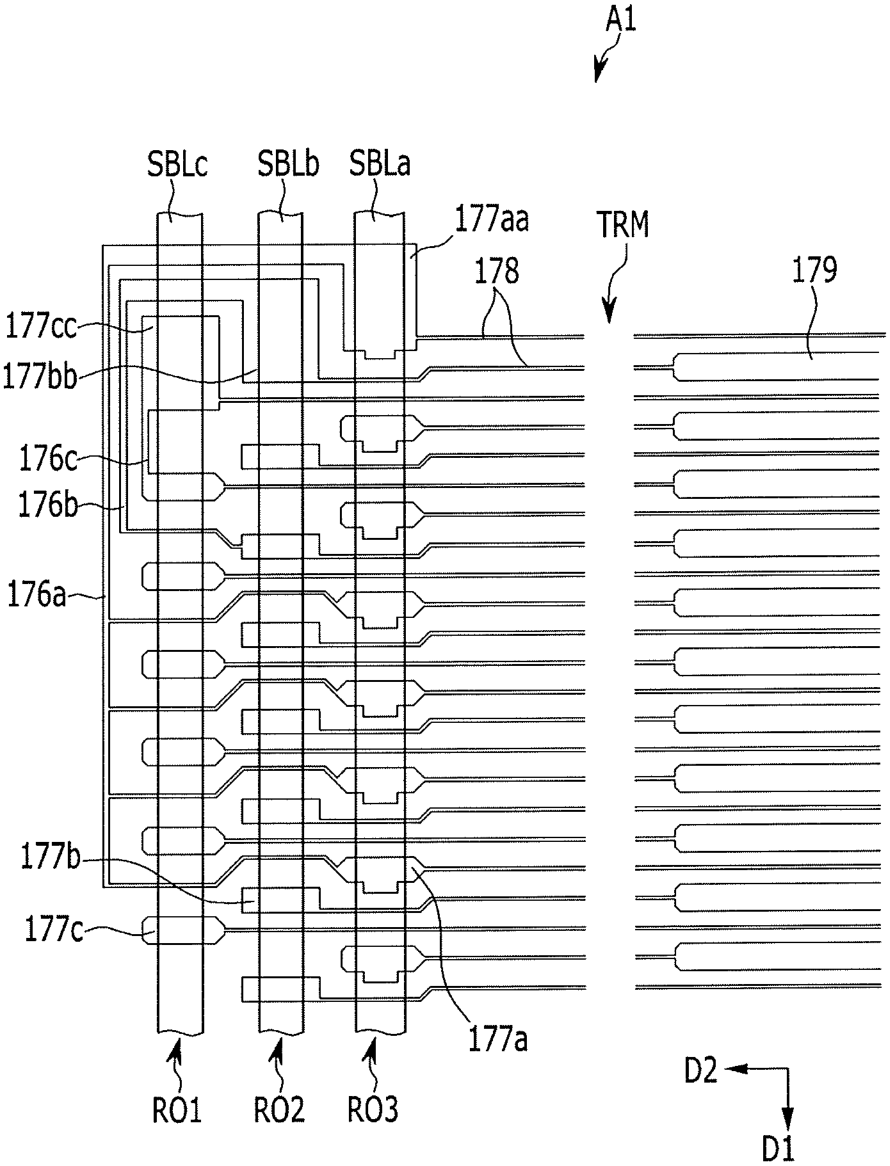
FIG. 14 and FIG. 15 are layout views of a portion of a display panel included in a display device according to an exemplary embodiment of the present invention.
Figure 15:
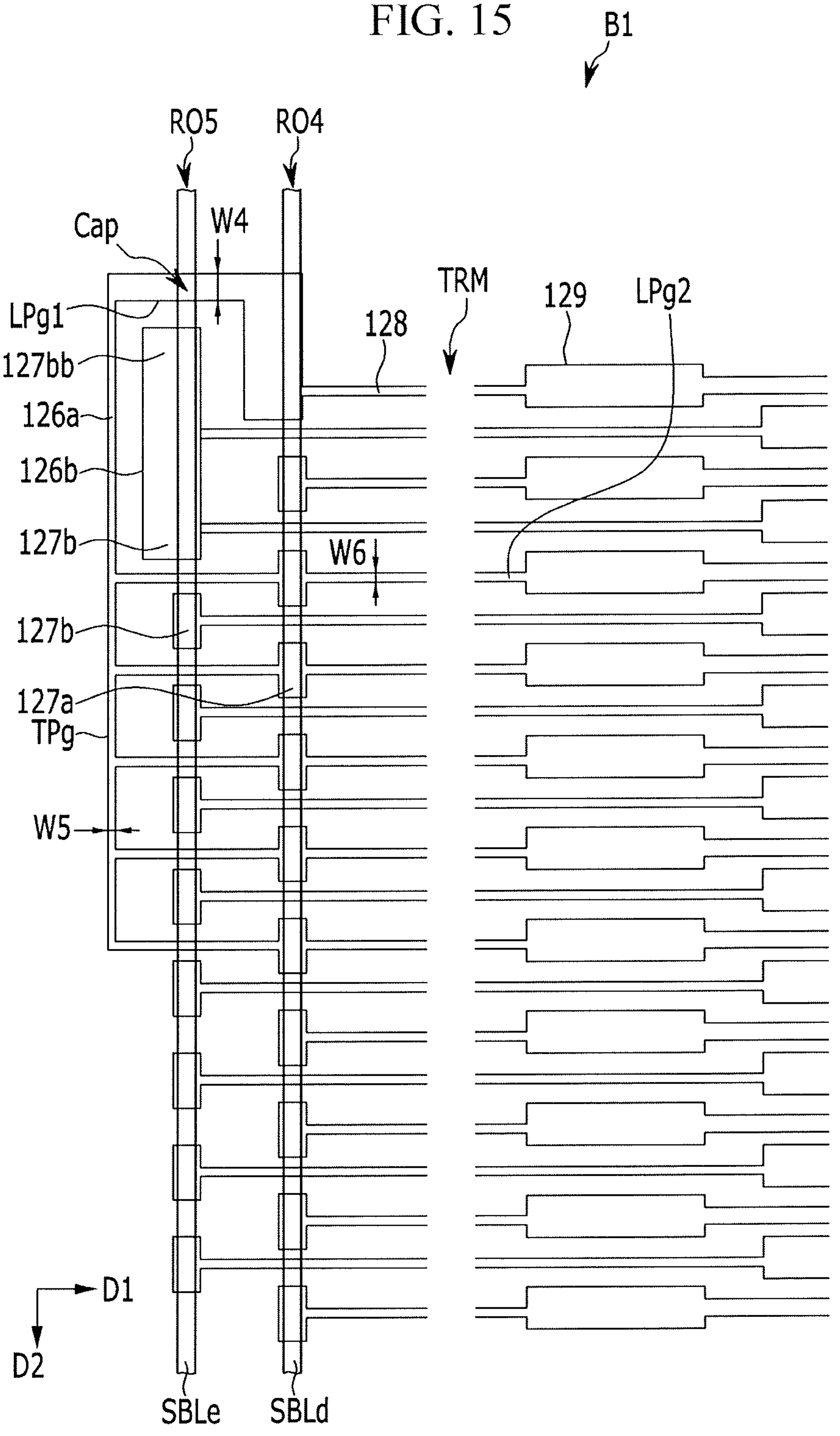

FIG. 11 to FIG. 13 are layout views of a display device according to an exemplary embodiment of the present invention. FIG. 14 and FIG. 15 are layout views of a portion of a display panel included in a display device according to an exemplary embodiment of the present invention.

Referring to FIG. 11, the display device according to an exemplary embodiment of the present invention includes a display panel 300, a gate driver 400, and a data driver 500.

The gate driver 400 may include at least one gate driving circuit 440 mounted on the display panel 300. Each gate driving circuit 440 is connected to at least one gate line 121. The gate driving circuit 440 may be mounted in an IC chip on the display panel 300. The gate driving circuit 440 is connected to the end portions 129 of a plurality of gate lines 121 and transmit gate signals to the gate lines 121.

The data driver 500 may include at least one data driving circuit 540 mounted on the display panel 300. Each data driving circuit 540 is connected to at least one data line 171. The data driving circuit 540 may be mounted in an IC chip on the display panel 300. The data driving circuit 540 is connected to the end portions 179 of a plurality of data lines 171 and transmit data signals to the data lines 171.

Referring to FIG. 12, the display device according to an exemplary embodiment of the present invention is substantially the same as the display device shown in FIG. 11, except that the data driving circuit 540 may be mounted on a flexible printed circuit film (FPC film) 510 attached to the display panel 300 in a tape carrier package (TCP) form. The flexible printed circuit film 510 may include a plurality of data transmitting lines (not shown) connected to the data driving circuit 540, and the data transmitting lines are connected to the data lines 171 through contact portions, transmitting data signals from the data driving circuit 540 to the data lines 171.

The display device according to an exemplary embodiment of the present invention may further include a printed circuit board (PCB) 550 including several driving devices such as a signal controller (not shown). The printed circuit board (PCB) 550 may transmit a power source voltage and several driving signals to the display panel 300 through the flexible printed circuit film 510.

Referring to FIG. 13, the display device according to an exemplary embodiment of the present invention is substantially the same as the display device shown in FIG. 11 or FIG. 12, except that the gate driver 400 may be integrated with the signal lines 121 and 171 and thin film transistors at the peripheral area PA of the display panel 300. In this case, the gate lines 121 are extended to the peripheral area PA and are connected directly to the gate driver 400.

The gate driver 400 may include a plurality of stages that are dependently connected to each other and that are sequentially arranged.

Referring to FIG. 14 and FIG. 15, the display panel 300 included in the display device according to an exemplary embodiment of the present invention is substantially the same as the display panel 300 described above in connection with FIG. 1 to FIG. 10, except that the gate test pads 127*a*, 127*b*, 127*aa*, and 127*bb* are disconnected from the end portions 129 of the gate lines 121. For example, a middle portion TRM of the gate lead lines 128 may be disconnected by, e.g., laser trimming the gate lead lines 128, and thus, the gate test pads 127*a*, 127*b*, 127*aa*, and 127*bb*, may be separated from the end portions 129 of the gate lines 121. Accordingly, the end portions 129 of a plurality of gate lines 121 forming a fan-out region may be aligned with a plurality of gate test pads 127*a*, 127*b*, 127*aa*, and 127*bb*, respectively, with the middle portion TRM positioned therebetween.

The data test pads 177*a*, 177*b*, 177*c*, 177*aa*, 177*bb*, and 177*cc* may be separated from the end portions 179 of the data lines 171. For example, a middle portion TRM of the data leads 178 may be disconnected by, e.g., laser trimming the data leads 178, and thus, the data test pads 177*a*, 177*b*, 177*c*, 177*aa*, 177*bb*, and 177*cc* may be separated from the end portions 179 of the data lines 171. Accordingly, the end portions 179 of a plurality of data lines 171 forming a fan-out region may be aligned with a plurality of data test pads 177*a*, 177*b*, 177*c*, 177*aa*, 177*bb*, and 177*cc*, respectively, with the middle portion TRM disposed therebetween.

While the present invention has been shown and described in connection with exemplary embodiments thereof, it is to be understood that various changes in form and detail may be made thereto without departing from the spirit and scope of the present invention as defined in the following claims.

What is claimed is:

1. A display panel, comprising:

a plurality of display signal lines which are in a display area;

a plurality of test pads which are in a peripheral area around the display area and are respectively connected to the plurality of display signal lines, the plurality of test pads including a first test pad, a second test pad, a third test pad, and a fourth test pad;

a first shorting bar which is connected to the first and second test pads and is extended in a first direction to cross the first and second test pads;

a second shorting bar which is connected to the third and fourth test pads and is extended in the first direction to be substantially parallel to the first shorting bar, wherein the first and second shorting bars are separated from each other in a second direction that is substantially perpendicular to the first direction; and a first connection line which has a first portion and a second portion, the first portion extending from the first test pad in the second direction to partially overlap the second shorting bar, and the second portion extending from second test pad in the second direction, wherein the first connection line includes a third portion extended in the first direction between the first portion and the second portion.

2. The display panel of claim 1, wherein the first test pad is larger than the second test pad.

3. The display panel of claim 2, further comprising:

a contact assistant which is on the first and second test pads; and a passivation layer positioned between the first shorting bar and the contact assistant, wherein the passivation layer includes a plurality of first contact holes on the first test pad and one or more second contact holes on the second test pad, and a number of the first contact holes is greater than a number of the second contact holes.

4. The display panel of claim 1, wherein a width of the first portion is larger than a width of the second portion.

5. The display panel of claim 1, wherein the first test pad and the second test pad are disposed in a same row of the plurality of test pads.

6. The display panel of claim 5, wherein the plurality of test pads are alternately arranged in a plurality of rows or columns.

7. The display panel of claim 1, further comprising:

a second connection line which electrically connects the third test pad with the fourth test pad, wherein the second shorting bar crosses the third and fourth test pads.

8. The display panel of claim 1, wherein the first and second test pads and the first connection line are at a same layer, and the first shorting bar is at a different layer from the first and second test pads.

9. The display panel of claim 1, wherein the plurality of display signal lines form a fan-out region in the peripheral area.

10. A display panel, comprising:

a first test pad positioned at a first location of a peripheral area of the display panel, the first test pad connected to a first signal line;

a second test pad positioned at a second location of the peripheral area, the second test pad connected to a second signal line;

a first shorting bar and a second shorting bar extending in a first direction substantially parallel to each other, wherein the first shorting bar is connected to the first test pad and the second test pad through a contact assistant; and a connection line connecting the first test pad to the second test pad, wherein the connection line includes a first portion, a second portion and a third portion, wherein the first and second portions extend in a second direction crossing the first direction, and the third portion extends in the first direction, wherein the first portion extends from the first test pad, crossing the second shorting bar, to a first point beyond the second shorting bar, the second portion extends from the second test pad, crossing the second shorting bar, to a second point beyond the second shorting bar, wherein the third portion is connected to the first and second points; and wherein the first test pad has a larger area than the second test pad.

* * * * *